United States Patent
Sanchez Ruiz et al.

(10) Patent No.: US 10,908,185 B2
(45) Date of Patent: Feb. 2, 2021

(54) HIGH-VOLTAGE LEAD-IN INSULATING DEVICE

(71) Applicants: ORMAZABAL PROTECTION & AUTOMATION, S.L.U., Bizkaia (ES); ORMAZABAL Y CIA, S.L.U., Bizkaia (ES)

(72) Inventors: Juan Antonio Sanchez Ruiz, Bizkaia (ES); Miguel Alvarez Escalona, Bizkaia (ES); Jose Maria Rua Sanchez, Bizkaia (ES); Jose Luis Sabas Fernandez, Bizkaia (ES); Luis Ranero Torres, Bizkaia (ES)

(73) Assignees: ORMAZABAL PROTECTION & AUTOMATION, S.L.U., Bizkaia (ES); ORMAZABAL Y CIA, S.L.U., Bizkaia (ES)

( * ) Notice: Subject to any disclaimer, the term of this patent is extended or adjusted under 35 U.S.C. 154(b) by 154 days.

(21) Appl. No.: 16/095,250

(22) PCT Filed: Apr. 17, 2017

(86) PCT No.: PCT/ES2017/070238
§ 371 (c)(1),
(2) Date: Oct. 19, 2018

(87) PCT Pub. No.: WO2017/182689
PCT Pub. Date: Oct. 26, 2017

(65) Prior Publication Data
US 2019/0146006 A1  May 16, 2019

(30) Foreign Application Priority Data

Apr. 19, 2016 (EP) ..................... 16382176

(51) Int. Cl.
*G01R 15/14* (2006.01)
*H01B 17/26* (2006.01)
(Continued)

(52) U.S. Cl.
CPC .......... *G01R 15/142* (2013.01); *H01B 17/26* (2013.01); *H01R 13/53* (2013.01); *H02B 13/0356* (2013.01)

(58) Field of Classification Search
CPC ...... G01R 15/142; H01B 17/26; H01R 13/53; H02B 13/0356
See application file for complete search history.

(56) References Cited

U.S. PATENT DOCUMENTS

| 2014/0370741 | A1* | 12/2014 | Bolcato | H01B 9/006 439/471 |
| 2017/0184634 | A1* | 6/2017 | Wentzel | G01R 15/142 |
| 2017/0250499 | A1* | 8/2017 | Sica | G01R 15/16 |

FOREIGN PATENT DOCUMENTS

| EP | 0851442 B1 | 2/2004 |
| EP | 2600363 A1 | 6/2013 |

(Continued)

*Primary Examiner* — Son T Le
*Assistant Examiner* — Adam S Clarke
(74) *Attorney, Agent, or Firm* — Kutak Rock LLP

(57) ABSTRACT

The lead-in insulating device (1) of the present invention allows the passage of a live conductor (5) through a wall (18) of high-voltage electrical equipment (14), and in turn allows sensing voltage and current, for which purpose it comprises at least two electric shields (6, 7) and at least one current measurement element (12, 13), installed such that they allow detecting the presence/absence of voltage and precisely measuring the voltage and current, as well as a simple and rapid installation/removal thereof.

14 Claims, 2 Drawing Sheets

(51) Int. Cl.
*H01R 13/53* (2006.01)
*H02B 13/035* (2006.01)

(56) References Cited

FOREIGN PATENT DOCUMENTS

EP 3001204 A1 3/2016
WO 20160455692 A1 3/2016

\* cited by examiner

HIGH-VOLTAGE LEAD-IN INSULATING DEVICE

This is the United States National Stage of Patent Cooperation Treaty Application No. PCT/ES2017/070238 filed Apr. 17, 2017, which claims priority to European Patent Application No. EP16382176.2 filed Apr. 19, 2016, the disclosures of which are incorporated herein by reference in their entireties.

OBJECT OF THE INVENTION

The present invention relates to the field of electric power distribution and transformation, and more specifically to a lead-in insulating device, which can be applied at a connection point between high-voltage electrical equipment and at least one cable, and which allows sensing current and voltage.

BACKGROUND OF THE INVENTION

High-voltage electrical equipment or cells used today in electric power distribution installations, for switching and/or protection of the power grid, comprise different compartments, such as the cable compartment, for example, where line connection cables can be received or where they can be provided with an outlet towards other distribution installations.

To perform joint detection and/or measurement of current and voltage at a line connection point or outlet of high-voltage electrical equipment, different elements must be used, such as for example inductive current sensing elements and capacitive voltage sensing elements.

A capacitive voltage sensing element consists of an electric shield, which makes the electric field uniform, provided in lead-in insulators for the connection of high-voltage electrical equipment which obtains a capacitive voltage signal through said shield. This capacitive voltage signal is normally used for indicating or detecting the presence/absence of voltage and allows, as stated, obtaining voltage measurements, using to that end a measuring circuit arranged in parallel with the device for indicating or detecting the presence/absence of voltage.

Generally, lead-in insulators for connection comprise a single electric shield from which they obtain the voltage signal which is used both for detecting the presence/absence of voltage and for measuring the voltage. However, this voltage measuring system is not reliable, because once the high-voltage electrical equipment is installed in the field, connecting the cables with coupling connectors on the lead-in insulators can bring about changes in precision of the voltage measurement. This is due to the geometry of the coupling connectors, because the connection of these connectors on lead-in insulators changes the distribution of the electric field and, in fact, its magnitude, so the voltage signal that is obtained through the electric shield also changes. This voltage signal that is obtained can be enough for detecting the presence/absence of voltage, but not for measuring it.

One solution for taking a precise voltage measurement can be the use of T-shaped coupling connectors, which allow coupling a voltage sensor in their open end that is not affected by the electric field, such as the solution described in patent EP1391740B1, for example. However, this solution has the drawback of its high cost.

Another example can be mentioned, specifically patent EP0851442B1, which discloses a lead-in insulator comprising two electric shields, one for detecting the presence/absence of voltage and another one for measuring the voltage. Furthermore, the insulator of this latter patent mentioned also includes an inductive current sensing element encapsulated in a body of insulating material around the electric shield intended for measuring the voltage. The electric shield intended for detecting the presence/absence of voltage is encapsulated in said body of insulating material around a primary conductor and arranged axially displaced along the primary conductor with respect to said electric shield for measuring the voltage.

Likewise, the insulator in said patent EP0851442B1 also describes an outer frustoconical-shaped terminal for connecting a cable with a coupling connector, such as for example a T-shaped coupling connector. The electric shield intended for measuring the voltage is located very close to the connection between the cable and the frustoconical terminal of the insulator, in a position located before the electric shield intended for detecting the presence/absence of voltage. In this sense, as explained above, due to the geometry of the coupling connector, a variation in the electric field takes place, and this renders the voltage measurement imprecise.

The option of arranging the shielded and grounded inductive current sensing element, such that the voltage signal obtained by the electric shield for measuring the voltage is not affected by the electric field, and therefore the voltage measurement does not change, is already known as a solution for controlling the electric field in the area where the electric shield intended for measuring the voltage is encapsulated.

However, this solution has the drawback relating to the encapsulation of the different elements. Due to thermal stress occurring in the attachment of the body of insulating material with the inductive current sensing element, specifically due to the different coefficients of thermal expansion of the materials (insulating material of the body of the insulator and material of the inductive current sensing element), there may be air pockets or gaps between the different surfaces, and these could result in the generation of partial discharges that would degrade the insulating materials and could end with the dielectric breakdown of the insulating means. There could also be problems in the shielding of the inductive current sensing element (adhesion problems).

Furthermore, the fact that the inductive current sensing element is encapsulated entails the drawback that if an inductive current sensing element having a different transformation ratio is needed, or if it needs to be replaced for any other reason, the entire insulator must be replaced, with the consequences all this entails, the long time required for the replacement, the labor cost, etc.

In addition, the zero sequence current measurement is taken by means of an inductive current sensing element installed around the cables, containing the three phases (as shown in the example of FIG. 1 corresponding to the prior art). This entails the drawback that the zero sequence current sensing elements have to be installed and tested in the field to prevent any installation error.

Furthermore, if the toroidal current sensing element has to be replaced, first it is necessary to remove the coupling connector from the cable, and then later install it again once the toroidal current sensing element has been replaced. This entails considerable time consumption until restoring the power supply to consumers, a lowering of the supply quality, costs for the supply company, trouble for customers, etc.

DESCRIPTION OF THE INVENTION

The present invention solves the problems and drawbacks mentioned above, providing a high-voltage lead-in insulating device that can be applied in the field of electric power distribution and transformation. The insulating device comprises a body of insulating material and a conductor internally going through said body of insulating material, such that it allows the passage of the mentioned live conductor through a wall of high-voltage electrical equipment. In this sense, two ends of the body of insulating material are distinguished, a first end intended for being in the inner part of the high-voltage electrical equipment and a second end intended for being in the outer part of the high-voltage electrical equipment.

Furthermore, the insulating device allows sensing voltage and current signals, for which purpose it comprises at least two cylindrical electric shields encapsulated in the body of insulating material arranged around the conductor, i.e., encircling the conductor, and at least one current measurement element. More particularly, the first electric shield is located in an encapsulated manner in a position located before the second electric shield from the side of the second end of the insulating device where at least one cable can be connected with a female coupling connector (either of the screw-in or plug-in type). In turn, the second electric shield is located axially displaced towards the first end of the insulating device along the conductor with respect to the first electric shield.

Preferably, the first electric shield is grounded and allows making the electric field uniform, whereas the second electric shield is a capacitive voltage sensing element that allows detecting the presence/absence of voltage and measuring the voltage. The geometry of the female coupling connector therefore does not affect the voltage measurement, since the first electric shield located closest to said female coupling connector provides control of the electric field, and the voltage signal obtained by the second electric shield therefore does not change, thereby increasing precision in the voltage measurement.

Since the insulating device of the invention has at least two electric shields encapsulated inside a body of insulating material, said body of insulating material has an elongated configuration and comprises a central part arranged in the outer part of the high-voltage electrical equipment, the outer surface of which comprises grounded conducting means. Furthermore, there can be installed on the outer surface of said central part of the insulating device at least one current measurement element, such as a toroidal current sensing element, for example, containing, covering, or surrounding a phase of the high-voltage electrical equipment for measuring the phase current and/or a toroidal current sensing element containing the three phases of the high-voltage electrical equipment for measuring the zero sequence current.

Therefore, the insulating device can comprise one toroidal current sensing element for each phase of the high-voltage electrical equipment for measuring the phase current and/or a toroidal current sensing element containing the three phases of the high-voltage electrical equipment for measuring the zero sequence current for ground faults. These toroidal current sensing elements are installed in the actual insulating device and factory-tested, so any risk resulting from an error in the field installation thereof is prevented. Furthermore, if any toroidal current sensing element has to be replaced, the solution herein described is simpler, faster and less expensive because it is not necessary to remove/install the coupling connector of the cable to replace, for example, the toroidal current sensing element for measuring the zero sequence current. On the other hand, given that the toroidal current sensing elements are independent or can be separated from the insulating device, if any of them need to be replaced it is not necessary to replace the entire insulating device, as may occur in some examples of the prior art.

Given the elongated configuration of the insulating device, the possibility of being able to connect at least one cable in the second end of the insulating device by means of a heat-shrink connector has been contemplated, without affecting the toroidal current sensing elements as a result.

On the other hand, it is envisaged that the cables can be connected with the second end of the insulating device by means of plug-in female coupling connectors, since the insulating device can comprise at least one metallic part that is coupled to the wall of the high-voltage electrical equipment, such that the plug-in female coupling connectors can be anchored to said metallic part.

DESCRIPTION OF THE DRAWINGS

To complement the description that is being made and for the purpose of helping to better understand the features of the invention according to a preferred practical embodiment thereof, a set of drawings are attached as an integral part of said description, in which the following is depicted in an illustrative and non-limiting manner.

PREFERRED EMBODIMENT OF THE INVENTION

Several preferred embodiments are described below in reference to the aforementioned drawings, without this limiting or reducing the scope of protection of the present invention.

Figure 1:
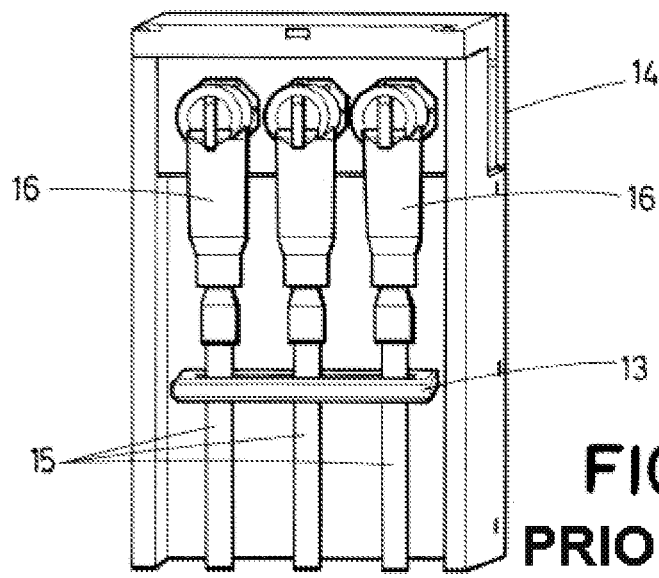
FIG. 1 shows a perspective view of the installation of a zero sequence current sensing element according to the actual prior art.
Figure 2:
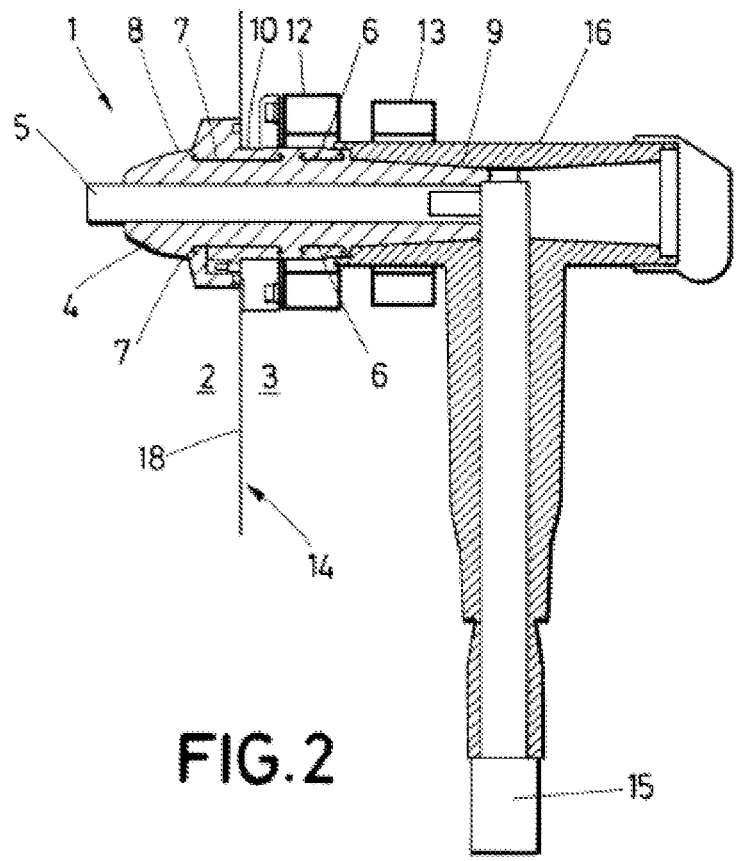
FIG. 2 shows a section view of the lead-in insulating device object of the invention, installed in high-voltage electrical equipment, according to a first embodiment in which screw-in female coupling connectors are used.

FIG. 2 shows a first embodiment of the lead-in insulating device (1), which basically comprises a body (4) of insulating material, such as epoxy resin, for example, and a conductor (5) going through said body (4) of insulating material. The insulating device (1) thereby allows the passage of said live conductor (5) through a wall (18) of high-voltage electrical equipment (14).

More specifically, as seen in FIG. 2, the insulating device (1) is mounted on the wall (18) of the high-voltage electrical equipment (14), a first end (8) of the body (4) of insulating material being located in an inner part (2) of the high-voltage electrical equipment (14); whereas a second end (9) of the body (4) of insulating material is located in an outer part (3) of the high-voltage electrical equipment (14).

At least one cable (15) can be connected on said second end (9) of the body (4) of insulating material by either a cable (15) with a screw-in type female coupling connector (16) such as the one shown in FIG. 2, or by means of a heat-shrink connector, which is not depicted in the drawings.

Figure 3:
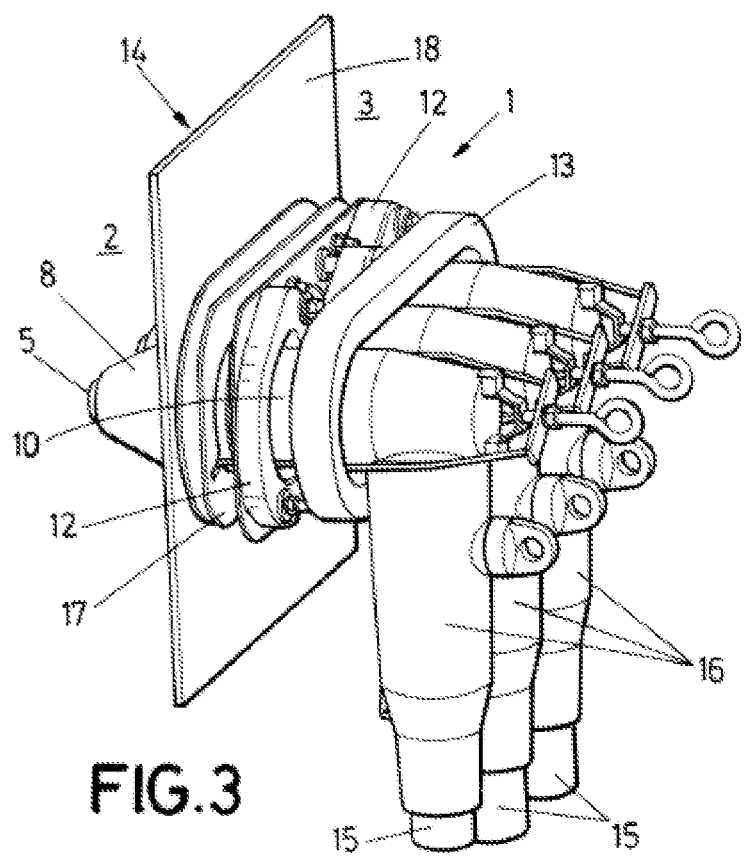
FIG. 3 shows a perspective view of the lead-in insulating device object of the invention, installed in high-voltage electrical equipment, according to a second embodiment in which plug-in female coupling connectors are used.

Furthermore, the lead-in insulating device (1) of the invention allows sensing voltage and current, for which purpose it comprises at least two cylindrical electric shields (6, 7) encapsulated in the body (4) of insulating material, and at least one current measurement element (12, 13), as shown in FIGS. 2 and 3.

The first electric shield (6) is arranged in an encapsulated manner, containing, i.e., surrounding the conductor (5) in a position located before the second electric shield (7) from the side of the second end (9) of the insulating device (1), whereas the second electric shield (7) is arranged in an encapsulated manner containing the conductor (5) and axially displaced towards the first end (8) of the insulating device (1) along the conductor (5) with respect to the first electric shield (6).

Therefore, the first electric shield (6) is grounded and is closer to the connection between the second end (9) of the body (4) of insulating material and the at least one cable (15) with the female coupling connector (16), as observed in FIG. 2, and therefore is intended for making the electric field between both components (9, 16) uniform. In other words, the first electric shield (6) allows keeping equipotential lines parallel to the conductor (5) going through said body (4) of insulating material, thereby preventing the existence of points with a high electric field, for example on the edge of the female coupling connector (16).

In turn, the second electric shield (7) is farther away from the connection between the second end (9) and the at least one cable (15) with the female coupling connector (16), and therefore it is a capacitive voltage sensing element that allows detecting the presence/absence of voltage, as well as precisely measuring the voltage, since the electric field does not affect sensing the voltage signal.

Notwithstanding the two above paragraphs, according to another preferred embodiment, it has been envisaged that that the first electric shield (6), in addition to being adapted to control and make the electric field uniform, may also allows detecting the presence/absence of voltage; while the second electric shield (7) has only voltage measuring functions in this preferred embodiment.

Figure 4:
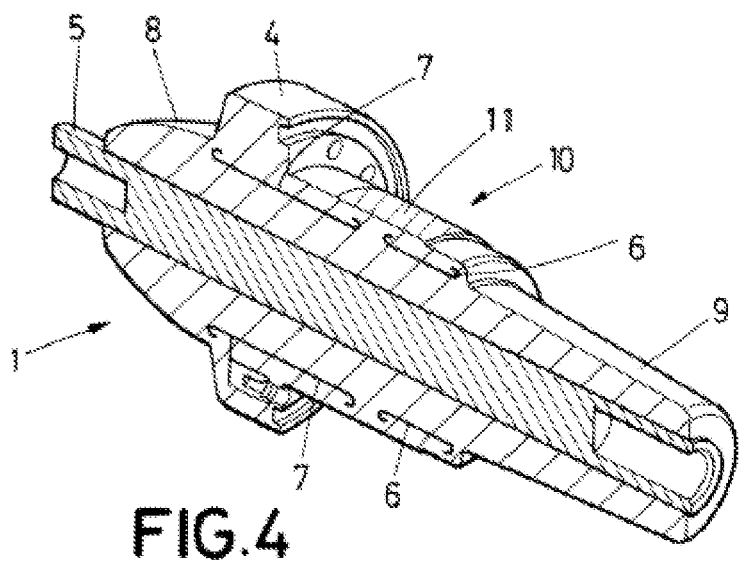
FIG. 4 shows a perspective section view of the lead-in insulating device of the invention, where its different inner components, according to the embodiments of FIGS. 2 and 3, can be seen.

As seen in FIGS. 2 and 4, the body (4) of insulating material has an elongated configuration and comprises a central part (10), which is arranged in the outer part (3) of the high-voltage electrical equipment (14). Said central part (10) comprises grounded conducting means (11), shown in FIG. 4, on its outer surface, and on said conducting means (11) containing it or surrounding it, the insulating device (1) comprises at least one current measurement element (12, 13), there being two in the embodiment shown in FIGS. 2 and 3. Therefore, according to the present example, a first current measurement element (12) is a toroidal current sensing element containing a phase of the high-voltage electrical equipment (14), such that each of the phases of the high-voltage electrical equipment (14) comprises its own toroidal current sensing element (12) for measuring the phase current. On the other hand, a second current measurement element (13) is a toroidal current sensing element intended for measuring the zero sequence current for ground faults, such that it is arranged containing or surrounding the three phases of the high-voltage electrical equipment (14), as observed in FIGS. 2 and 3.

Finally, the possibility of the lead-in insulating device (1) described herein being able to comprise a metallic part (17), shown in FIG. 3, coupled to the wall (18) of the high-voltage electrical equipment (14), such that said metallic part (17) allows the coupling of the at least one cable (15) with the at least one female coupling connector (16) of the plug-in type has been contemplated, according to a second preferred embodiment depicted in FIG. 3.

The invention claimed is:

1. Lead-in insulating device (1) between an inner part (2) and an outer part (3) of high-voltage electrical equipment (14), where said insulating device (1) comprises: a body (4) of insulating material and a conductor (5) internally going through said body (4) of insulating material, the body (4) of insulating material comprising a first end (8) being located in the inner part (2) of the high-voltage electrical equipment (14), and a second end (9) being located in the outer part (3) of the high-voltage electrical equipment (14), the second end (9) of the insulating body (4) can be connected with at least one cable (15) and—at least two electric shields (6, 7) arranged around the conductor (5) and encapsulated in the same body (4) of insulating material, characterized in that the first electric shield (6) is grounded and is located in a position before the second electric shield (7), and closer to the connection between the second end (9) of the body (4) of insulating material of the insulating device (1) and the at least one cable (15), the first electric shield (6) to control and make the electric field uniform, whereas the second electric shield (7) is located axially displaced towards the first end (8) of the insulating device (1) along the conductor (5) with respect to the first electric shield (6).

2. Insulating device (1) according to claim 1, characterized in that the second electric shield (7) is a capacitive voltage sensing element for detecting the presence/absence of voltage and measuring the voltage.

3. Insulating device (1) according to claim 1, characterized in that the body (4) of insulating material comprises a central part (10) intended for being located in the outer part (3) of the high-voltage electrical equipment (14), the outer surface of which comprises grounded conducting means (11).

4. Insulating device (1) according to claim 1, characterized in, that the body (4) of insulating material comprises a central part (10) being located in the outer part (3) of the high-voltage electrical equipment (14), the outer surface of which comprises grounded conducting means (11).

5. Insulating device (1) according to claim 4, characterized in that a first current measurement element (12) is a toroidal current sensing element containing a phase of the high-voltage electrical equipment (14).

6. Insulating device (1) according to claim 5, characterized in that it has one toroidal current sensing element (12) for each phase of the high-voltage electrical equipment (14).

7. Insulating device (1) according to claim 4, characterized in that a second current measurement element (13) is a toroidal current sensing element containing the three phases of the high-voltage electrical equipment (14).

8. Insulating device (1) according to claim 1, characterized in that the at least one cable (15) comprises a female coupling connector (16) that is coupled in the second end (9) of the body (4) of insulating material.

9. Insulating device (1) according to claim 8, characterized in that the female coupling connector (16) is of the screw-in type.

10. Insulating device (1) according to claim 8, characterized in that the metallic part (17) is adapted for the coupling of the at least one female coupling connector (16) of the plug-in type.

11. Insulating device (1) according to claim 1, characterized in that it additionally comprises a metallic part (17) for the coupling thereof to a wall (18) of the high-voltage electrical equipment (14).

12. Insulating device (1) according to claim 11, characterized in that the metallic part (17) is adapted for the coupling of the at least one female coupling connector (16) of the plug-in type.

13. Insulating device (1) according to claim 1, characterized in that it comprises a heat-shrink connector for the connection between the second end (9) and the at least one cable (15).

14. Insulating device (1) according to claim 1, characterized in that the first electric shield (6) is adapted to detect the presence/absence of voltage; while the second electric shield (7) has voltage measuring functions.

\* \* \* \* \*